(12) United States Patent
Renault (10) Patent No.: US 7,989,262 B2
(45) Date of Patent: Aug. 2, 2011

(54) METHOD OF SEALING A CAVITY

(75) Inventor: Mickael Renault, San Jose, CA (US)

(73) Assignee: Cavendish Kinetics, Ltd., Hertfordshire (GB)

( * ) Notice: Subject to any disclaimer, the term of this patent is extended or adjusted under 35 U.S.C. 154(b) by 280 days.

(21) Appl. No.: 12/267,186

(22) Filed: Nov. 7, 2008

(65) Prior Publication Data

US 2009/0215214 A1    Aug. 27, 2009

Related U.S. Application Data

(60) Provisional application No. 61/066,655, filed on Feb. 22, 2008.

(51) Int. Cl.
*H01L 21/44* (2006.01)

(52) U.S. Cl. . 438/107; 438/126; 438/127; 257/E21.499; 257/E21.502

(58) Field of Classification Search .............. 438/51–55, 438/107, 125–127; 257/E21.499, E21.502
See application file for complete search history.

(56) References Cited

U.S. PATENT DOCUMENTS

| | | | |
|---|---|---|---|
| 4,761,219 A | 8/1988 | Sasaki et al. |
| 5,270,264 A | 12/1993 | Andideh et al. |
| 5,279,669 A | 1/1994 | Lee |
| 5,292,370 A | 3/1994 | Tsai et al. |
| 5,346,578 A | 9/1994 | Benzing et al. |
| 5,504,026 A | 4/1996 | Kung |
| 5,614,055 A | 3/1997 | Fairbairn et al. |
| 5,861,344 A | 1/1999 | Roberts et al. |
| 5,872,058 A | 2/1999 | Van Cleemput et al. |
| 5,919,548 A | 7/1999 | Barron et al. |
| 6,012,336 A | 1/2000 | Eaton et al. |
| 6,051,121 A | 4/2000 | Givens et al. |
| 6,174,820 B1 | 1/2001 | Habermehl et al. |
| 6,174,850 B1 | 1/2001 | Michaud |
| 6,391,150 B1 | 5/2002 | Berger et al. |

(Continued)

FOREIGN PATENT DOCUMENTS

DE    10056716 A1    5/2002

(Continued)

OTHER PUBLICATIONS

Notification of Reasons for Rejection dated Feb. 17, 2009 for Japanese Patent Application No. 2006-546296 (CK004JP) and English translation thereof.

(Continued)

*Primary Examiner* — Hsien-ming Lee
(74) *Attorney, Agent, or Firm* — Patterson & Sheridan, LLP (57) ABSTRACT

Embodiments disclosed herein generally include methods of sealing a cavity in a device structure. The cavity may be opened by etching away sacrificial material that may define the cavity volume. Material from below the cavity may be sputter etched and redeposited over and in passageways leading to the cavity to thereby seal the cavity. Material may be sputter etched from above the cavity and redeposited in the passageways leading to the cavity as well. The sputter etching may occur in a substantially inert atmosphere. As the sputter etching is a physical process, little or no sputter etched material will redeposit within the cavity itself. The inert gases may sweep out any residual gases that may be present in the cavity after the cavity has been opened. Thus, after the sputter etching, the cavity may be substantially filled with inert gases that do not negatively impact the cavity.

20 Claims, 10 Drawing Sheets

U.S. PATENT DOCUMENTS

| | | | |
|---|---|---|---|
| 6,395,150 | B1 | 5/2002 | Van Cleemput et al. |
| 6,395,574 | B2 * | 5/2002 | Benzel et al. ............... 438/53 |
| 6,635,509 | B1 | 10/2003 | Ouellet |
| 6,861,277 | B1 | 3/2005 | Monroe et al. |
| 6,936,494 | B2 | 8/2005 | Cheung |
| 7,008,812 | B1 | 3/2006 | Carley |
| 7,163,896 | B1 | 1/2007 | Zhu et al. |
| 7,211,525 | B1 | 5/2007 | Shanker et |
| 7,235,281 | B2 | 6/2007 | Rusu et al. |
| 7,329,586 | B2 | 2/2008 | Vellaikal et al. |
| 7,344,996 | B1 | 3/2008 | Lang et al. |
| 7,648,855 | B2 * | 1/2010 | Gillot et al. ............ 438/106 |
| 7,648,859 | B2 * | 1/2010 | Robert ....................... 438/127 |
| 2001/0023991 | A1 | 9/2001 | Kakuhara |
| 2002/0011645 | A1 | 1/2002 | Bertin et al. |
| 2002/0064906 | A1 | 5/2002 | Enquist |
| 2002/0193037 | A1 | 12/2002 | Hofmann et al. |
| 2003/0001221 | A1 | 1/2003 | Fischer et al. |
| 2003/0138986 | A1 | 7/2003 | Bruner |
| 2003/0148550 | A1 | 8/2003 | Volant et al. |
| 2003/0153116 | A1 | 8/2003 | Carley et al. |
| 2004/0020782 | A1 | 2/2004 | Cohen et al. |
| 2004/0157426 | A1 | 8/2004 | Ouellet et al. |
| 2004/0159532 | A1 | 8/2004 | Tatic-Lucic et al. |
| 2004/0166603 | A1 | 8/2004 | Carley |
| 2004/0188785 | A1 | 9/2004 | Cunningham et al. |
| 2004/0245588 | A1 | 12/2004 | Nikkel et al. |
| 2005/0017313 | A1 | 1/2005 | Wan |
| 2005/0037608 | A1 | 2/2005 | Andricacos et al. |
| 2005/0164127 | A1 | 7/2005 | Reid et al. |
| 2006/0108675 | A1 | 5/2006 | Colgan et al. |
| 2006/0131501 | A1 * | 6/2006 | Ikushima et al. .......... 250/338.1 |
| 2006/0134825 | A1 | 6/2006 | DCamp et al. |
| 2006/0220173 | A1 | 10/2006 | Gan et al. |
| 2007/0235501 | A1 | 10/2007 | Heck |

FOREIGN PATENT DOCUMENTS

| | | | |
|---|---|---|---|
| EP | 751546 | A2 | 1/1997 |
| EP | 783182 | A2 | 7/1997 |
| EP | 1041629 | A1 | 10/2000 |
| EP | 1433740 | A1 | 6/2004 |
| EP | 1450406 | A1 | 8/2004 |
| JP | 63-198378 | | 8/1988 |
| JP | 63-307758 | A | 12/1988 |
| JP | 05-297413 | | 11/1993 |
| JP | 09-257618 | | 10/1997 |
| JP | 11-177067 | | 7/1999 |
| JP | 2003-506871 | | 7/1999 |
| JP | 2000-186931 | | 7/2000 |
| JP | 2001-133703 | | 5/2001 |
| JP | 2002-280470 | | 9/2002 |
| JP | 2003-035874 | | 2/2003 |
| WO | WO-97/07517 | A2 | 2/1997 |
| WO | WO-00/24021 | A1 | 4/2000 |
| WO | WO-00/33089 | A2 | 6/2000 |
| WO | WO-01/31664 | A1 | 5/2001 |
| WO | WO-01/56066 | A1 | 8/2001 |
| WO | WO-01/83363 | A1 | 11/2001 |
| WO | WO-01/92842 | A2 | 12/2001 |
| WO | WO-02/16150 | A1 | 2/2002 |
| WO | WO-02/063657 | A2 | 8/2002 |
| WO | WO-03/028059 | A1 | 4/2003 |
| WO | WO-03/069645 | A1 | 8/2003 |
| WO | WO-03/085719 | | 10/2003 |
| WO | WO-2004/096696 | A1 | 11/2004 |
| WO | WO-2005/060002 | A1 | 6/2005 |
| WO | WO-2005/061376 | A1 | 7/2005 |
| WO | WO-2007/015097 | A1 | 2/2007 |
| WO | WO-2007/017672 | A1 | 2/2007 |
| WO | WO-2007/060414 | A1 | 5/2007 |
| WO | WO-2007/060416 | A1 | 5/2007 |

OTHER PUBLICATIONS

Notification of the First Office Action for Chinese Patent Application No. 200480039028.0 (CK004—China) dated Feb. 27, 2009.

Office Action for European Patent Application No. 04805944.8 dated Jun. 22, 2009 (CK004EP).

Chan, et al., "Comprehensive Static Characterization of Vertical Electrostatically Actuated Polysilicon Beams", vol. 16, No. 4, Oct. 1999, pp. 58-65.

International Preliminary Report and Written Opinion for International Application No. PCT/GB2006/2959 dated Feb. 5, 2008.

International Preliminary Report and Written Opinion for International Application No. PCT/GB2006/004350 dated May 27, 2008.

International Preliminary Report and Written Opinion for International Application No. PCT/GB2006/004354 dated May 27, 2008.

International Preliminary Report on Patentability for International Application No. PCT/GB2004/005122 dated Nov. 16, 2005.

International Preliminary Report on Patentability for International Application No. PCT/GB2004/001773 dated Jun. 22, 2008.

International Search Report for International Application No. PCT/GB2006/004354 dated Mar. 12, 2007.

International Search Report for International Application No. PCT/GB2006/002959 dated Oct. 25, 2006.

International Search Report for International Application No. PCT/GB2006/004350 dated Mar. 12, 2007.

International Search Report for International Application No. PCT/GB2004/005122 dated Mar. 2, 2005.

International Search Report for International Application No. PCT/GB2004/001773 dated Sep. 6, 2004.

Mercado et al., "A mechanical approach to overcome RF MEMS switch stiction problem", vol. conf. 53, dated May 27, 2003, pp. 377-384.

Written Opinion for International Application No. PCT/GB2004/001773 dated Sep. 6, 2004.

Written Opinion for International Application No. PCT/GB2004/005122 dated Feb. 28, 2005.

Zavracky et al., "Micromechanical Switches Fabricated Using Nickel Surface Micromachining", Journal of Microelectromechanical Systems, IEEE Service Center, Piscataway, NJ, US, vol. 6, No. 1, dated Mar. 1997.

Liu et al. "Sealing of micro machined cavities using chemical vapour deposition methods: characterisation and optimisation", J. MEMS, 8, pp. 135-145, 1999.

Park et al. Wafer-scale film encapsulation of micromachined accelerometers, The 12th Int. Conf. on Solid State Sensors, Actuators and Microsystems, Boston, Jun. 8-12, 2003 pp. 1903-1906.

Stahl et al. Thin film encapsulation of acceleration sensors using polysilicon sacrificial layers, The 12th Int. Conf. on Solid State Sensors, Actuators and Microsystems, Boston, Jun. 8-12, 2003 pp. 1899-1902.

Search report and written opinion for PCT/US2009/033927 (CK051PCT) dated Jan. 7, 2010.

* cited by examiner

METHOD OF SEALING A CAVITY

CROSS-REFERENCE TO RELATED APPLICATIONS

This application claims benefit of U.S. Provisional Patent Application Ser. No. 61/066,655, filed Feb. 22, 2008, which is herein incorporated by reference.

BACKGROUND OF THE INVENTION

1. Field of the Invention

Embodiments of the present invention generally relate to a method of sealing a cavity in a micro-electromechanical system (MEMS) or a nano-electromechanical system (NEMS).

2. Description of the Related Art

Many MEMS and NEMS devices require encapsulation in a low or very low pressure environment. This is especially true for transducers, such as those used in inertial sensors, which are affected by squeeze-film damping effects. In order to achieve this, methods such as Chemical Vapor Deposition (CVD) have been used to the seal cavities in which MEMS devices are enclosed.

These methods share a disadvantage, however, in that they use reactive gases in order to deposit the material needed to seal the cavity. These reactive gases can adversely affect the operation of the enclosed device during the sealing step but also after the cavity has been sealed. This phenomenon is particularly harmful to transducers, which may heat-up during operation and reach temperature levels which help to catalyze potential chemical reactions.

In order to solve this problem, methods for removing the residual gases were developed. A typical approach is to use a "getter" material. These materials, usually highly reactive metals, are capable of absorbing finite quantities of gas. This approach has several disadvantages, however, because the getter material will need to be inserted within the cavity housing the device. When wafer level packaging is used, the getter is usually deposited on the inner surface of a device package or on the inner surface of a wafer facing the cavity to vacuum seal. Wafer level packaging, however, is by definition not an integrated sealing method and can't be used to form small cavities. The getter material could also be deposited on the substrate, in the cavity containing the device. This methodology however would induce a dramatic increase in the cavity size meaning a lower density of device encapsulated per area. It would also complicate the existing process flows. Moreover, these disadvantages will be exacerbated by the nature of the getter material typically being incompatible with standard Complementary Metal-Oxide-Semiconductor (CMOS) processes, thereby requiring further alterations to the process flows. Another disadvantage with methods such as CVD is that material may be deposited inside the cavity, thereby interfering with the operation of the enclosed device.

Accordingly, there is a clear need for a method of sealing a cavity which is compatible with standard CMOS processes and which does not rely on getter materials or reactive gases.

SUMMARY OF THE INVENTION

Embodiments disclosed herein generally include methods of sealing a cavity in a device structure. The cavity may be opened by etching away sacrificial material that may define the cavity volume. Material from below the cavity, above the cavity, and outside the cavity may be sputter etched and redeposited over and in passageways leading to the cavity to thereby seal the cavity. Material may be sputter etched from above the cavity and redeposited in the passageways leading to the cavity as well. The sputter etching may occur in a substantially inert atmosphere. As the sputter etching is a physical process, little or no sputter etched material will redeposit within the cavity itself. The inert gases may sweep out any residual gases that may be present in the cavity after the cavity has been opened. Thus, after the sputter etching, the cavity may be substantially filled with inert gases that do not negatively impact the cavity.

In one embodiment, a method of forming a device structure is disclosed. The method may include depositing at least one sacrificial layer over a substrate and removing a portion of the at least one sacrificial layer to define a shape of a cavity and at least one passage to be formed. The method may also include depositing at least one encapsulating layer over the at least one sacrificial layer and removing a portion of the at least one encapsulating layer to expose a portion of the at least one sacrificial layer through at least a first side of the at least one encapsulating layer. The method may additionally include removing the at least one sacrificial layer to form the cavity and a first passage through the at least one encapsulating layer and sputter etching material from the substrate and redepositing the sputter etched material in the first passage to seal the first passage.

In another embodiment, a method of forming a device structure is disclosed. The method may include depositing at least one sacrificial layer over a substrate and removing a portion of the at least one sacrificial layer to define a shape of a cavity and at least one passage to be formed. The method may also include depositing a first encapsulating layer over the at least one sacrificial layer, depositing a second encapsulating layer over the first encapsulating layer, and removing a portion of the first encapsulating layer to expose a portion of the at least one sacrificial layer through a side of the first encapsulating layer. The method may additionally include removing the at least one sacrificial layer to form the cavity and a first passage through the first encapsulating layer and sputter etching material from the second encapsulating layer and redepositing the sputter etched second encapsulating material in the first passage to seal the first passage.

In another embodiment, a method of forming a device structure is disclosed. The method may include depositing at least one sacrificial layer over a substrate and removing a portion of the at least one sacrificial layer to define a shape of a cavity and at least one passage to be formed. The method may also include depositing a first encapsulating layer over the at least one sacrificial layer defining a shape of the cavity, depositing a second encapsulating layer over the first encapsulating layer, and removing a portion of the first encapsulating layer to expose a portion of the at least one sacrificial layer through a side of the first encapsulating layer. The method may additionally include removing the at least one sacrificial layer to form the cavity and a first passage through the first encapsulating layer and sputter etching material from the second encapsulating layer and the substrate and redepositing the sputter etched second encapsulating material and material from the substrate in the first passage to seal the first passage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic top view of a structure having a plurality of cavities according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
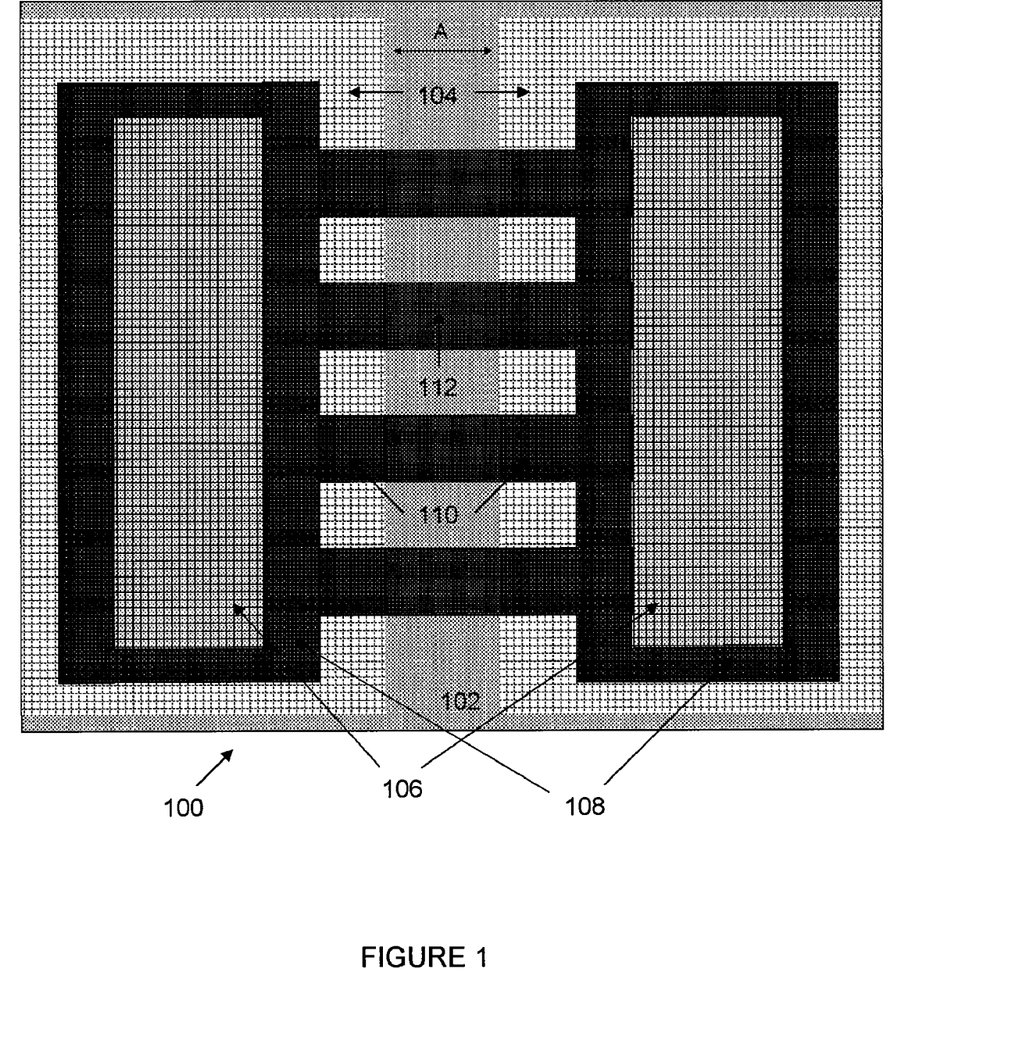

Embodiments disclosed herein include methods of sealing a cavity formed in a device structure. FIG. 1 is a schematic top view of a structure 100 having a plurality of cavities according to one embodiment. The structure 100 comprises a substrate 102 having one or more layers 104 formed thereover. Between the layers 104 and the substrate 102, one or more cavities may be formed.

In the embodiment shown in FIG. 1, one or more sacrificial layers of sacrificial material 108 may be formed between the substrate 102 and the one or more layers 104. The sacrificial material 108 may define the volume of open space within the cavity to be formed. The cavity is formed by removing the sacrificial material 108. Within each cavity, one or more devices 106 may be present. Sacrificial material 108 may be present in a passage 110 through the cavity area. The passage 110 may permit etching gases or liquids enter into the cavity and remove the sacrificial material 108. In one embodiment, sacrificial material 108 may also be exposed over the substrate 102 as a channel 112 between the one or more layers 104. Upon removal of the sacrificial material 108, the devices 106 will be released within the cavities. It is to be understood that while the passages 110 have been shown on one side of the eventual cavity, the passages 110 may be on both sides of the cavity to be formed. Additionally, while the passages 110 have been shown as straight with a line of sight to the devices 106, the passages 110 may be shaped to provide little or no line of sight to the devices 106.

Figure 2:
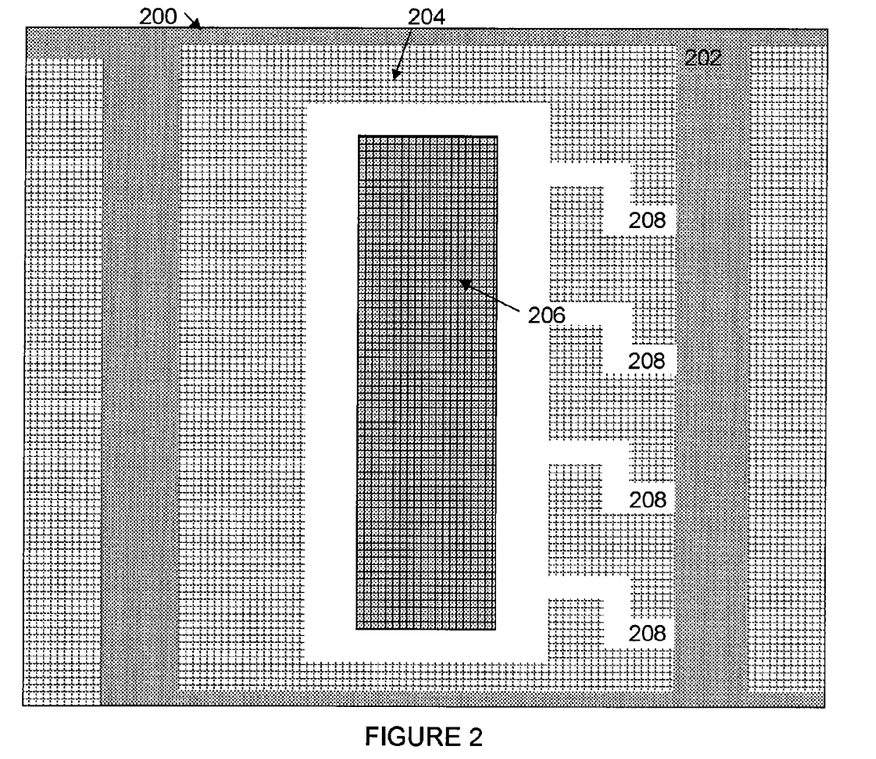
FIG. 2 is a schematic top view of a structure having a cavity according to another embodiment.

FIG. 2 is a schematic top view of a structure 200 having a cavity 204 according to another embodiment. The cavity 204 is formed over a substrate 202 and is accessed through one or more passages 208. As shown in FIG. 2, the passages 208 have a kink such that there is no line of sight path between the device 206 contained in the cavity 204 and the entrance to the passages 208. It is to be understood that while the passages 208 have been shown on one side of the cavity 204, the passages 208 may be present on both sides. Additionally, while the passages 208 have been shown as blocking any line of sight path to the device 206, the passages 208 may be designed to provide a complete or less than complete line of sight path to the device 206.

Figure 3A:
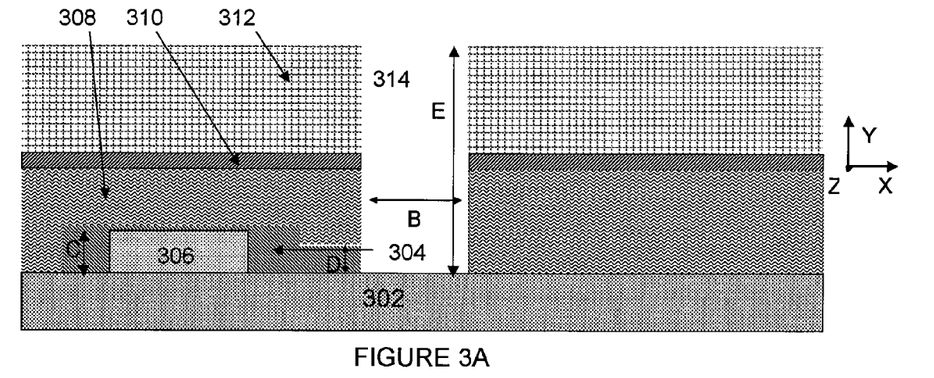
FIG. 3A is a schematic side view of a structure having a side release passage having a height less than a height of the cavity.
Figure 3B:
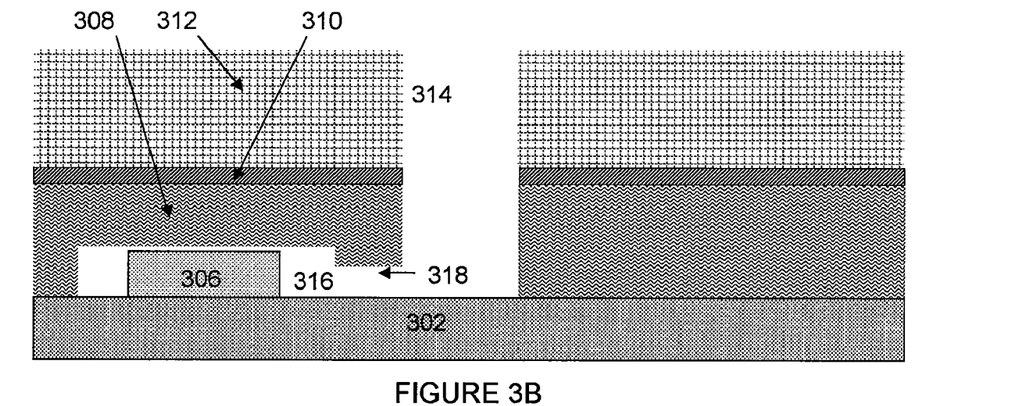
FIG. 3B is a schematic side view of the structure of FIG. 3A having the sacrificial material removed.

FIG. 3A is a schematic side view of a structure having a side release passage having a height less than a height of the cavity. FIG. 3B is a schematic side view of the structure of FIG. 3A having the sacrificial material removed. The structure has a substrate 302 upon which a device 306 may be formed. In one embodiment, the substrate 302 may comprise a silicon based material. In another embodiment, the substrate 302 may comprise multiple layers of a device structure such as a CMOS structure. The device 306 may comprise any MEMS, NEMS, micro-opto-electromechanical system (MOEMS) device, nano-opto-electromechanical system (NOEMS) device, or combinations thereof. The device may be formed at any point within the structure. For example, the device may be formed above or below a CMOS structure. Additionally, the device may be formed within a stack such that additional layers of the structure (i.e., not the device) may be present above the device. The device may be used in the back end of line (BEOL) processing of a metal system. The device may also be formed in the back end of line of any other semiconductor front end technology, such as a bipolar process, or a bi-CMOS, or a SiGe, or a GaAs, GaAlAs or other III/V or II/VI, or any other front end semiconductor process. In one embodiment, the device may be formed on glass. It is to be understood that while one device 306 is shown, multiple devices 306 may be present. If multiple devices 306 are present, the devices 306 may be identical or different and may perform the same or different functions. Also, while a device 306 has been shown, it is to be understood that the device 306 may not be present.

The device 306 may be enclosed in a sacrificial material 304. The sacrificial material 304 may comprise a spin-on organic film. However, other spin-on films and Plasma Enhanced Chemical Vapor Deposition (PECVD) materials, such as spin on glass, silicon nitride, silicon dioxide, amorphous silicon and amorphous carbon, can be employed to the same effect. Additional deposition methods that may be used to deposit the sacrificial material 304 include atomic layer deposition (ALD), physical vapor deposition (PVD), chemical vapor deposition (CVD), and other conventional deposition methods. A spin on sacrificial material 304 may flow over any irregularities in the underlying layers, thereby producing a flat layer where the thickness of the film depends on the height of the underlying material. The sacrificial material 304 may be deposited and then patterned to remove portions of the sacrificial material 304 that do not affect the cavity to be formed.

One or more other layers 308, 310, and 312 may be deposited over the sacrificial material 304. The one or more other layers 308, 310, and 312 may form a part of a structure to be formed above the device 306. A trench 314 may be formed in the structure by patterning the one or more other layers 308, 310, and 312. The trench may have a height shown by arrows "E" from the substrate 302 to the top of the uppermost layer 312 and a width shown by arrows "B". The height "E" of the trench extends in the Y axis, and the width "B" extends along the X axis. The trench may extend along the Z axis (into the paper) for many microns. In one embodiment, the trench may extend for a distance along the Z axis for about 1 mm or greater. The ratio of the height to the width is known as an aspect ratio. In one embodiment, the aspect ratio opening may be proportional to an ejection cosine distribution of sputtered material. In another embodiment, the aspect ratio may be proportional to the angular distribution of the incoming species. By proportional, it is to be understood to include not only linearly proportional, but also inversely proportional, and any general relationship between the aspect ratio and the sputtered material. In one embodiment, the aspect ratio of the trench 314 may be about 1:1. In another embodiment, the aspect ratio of the trench 314 may be greater than about 2:1. In one embodiment, the width may be between about several nanometers to about a hundred micrometers. In one embodiment, the width may be between about 1 micrometer to about 50 micrometers.

The sacrificial material 304, after patterning, provides the shape of the cavity 316 to be formed as well as the release passage 318. The cavity 316 may have a height shown by arrows "C" while the passage 318 may have a height shown by arrows "D". The passage 318 may extend along the trench for the entire length of the trench along the Z axis. In one embodiment, the passage 318 may extend along the trench for less than the entire length along the Z axis. In the embodiment shown in FIGS. 3A and 3B, the passage 318 has a height less than a height of the cavity 316. It is to be understood that the passage 318 may have a height substantially equal to the height of the cavity 316 if desired. In one embodiment, the cavity release passage 318 may have a height of about 10 micrometers or less.

After the one or more other layers 308, 310, and 312 have been patterned so that the sacrificial material 304 is exposed, the sacrificial material 304 may be removed to release the device 306 in the cavity 316. In one embodiment, the sacrificial material 304 may be removed by plasma etching. In one embodiment, the etching gases or liquids may comprise hydrogen, fluorine, oxygen, hydrogen fluoride, chlorine, hydrochloric acid, nitrogen, helium, xenon difluoride, anhydrous hydrogen fluoride, fluorine based etching gases or liquids, oxygen based etching gases or liquids, hydrogen based etching gases or liquids, or combinations thereof.

Figure 4A:
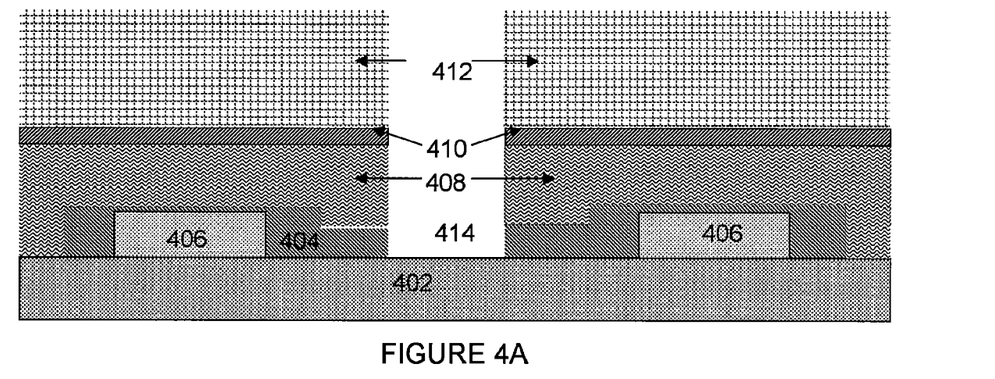
FIG. 4A is a schematic side view of a structure having a plurality of cavities each having a side release passage having a height less than a height of the cavity.
Figure 4B:
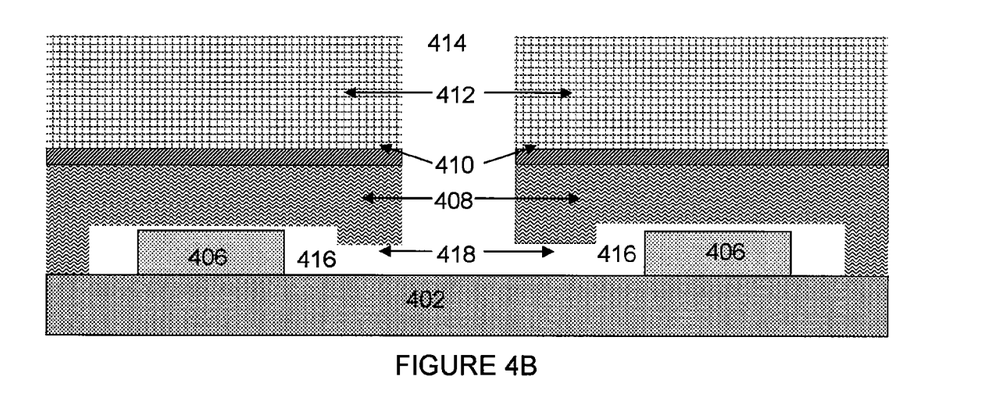
FIG. 4B is a schematic side view of the structure of FIG. 4A having the sacrificial material removed.

FIG. 4A is a schematic side view of a structure having a plurality of cavities each having a side release passage having a height less than a height of the cavity. FIG. 4B is a schematic side view of the structure of FIG. 4A having the sacrificial material removed. The structure has a substrate 402 upon which a plurality of devices 406 may be formed. In one embodiment, the substrate 402 may comprise a silicon based material. In another embodiment, the substrate 402 may comprise multiple layers of a device structure such as a CMOS structure. The devices 406 may comprise any MEMS, NEMS, MOEMS, or NOEMS devices, or combinations thereof. In one embodiment, the device 406 that may comprise a microfluidic channel that provides temperature control and improved reliability in integrated circuits. Additionally, the device 406, in general, can be any device that may be sealed within a cavity over a substrate.

The devices 406 may be enclosed in a sacrificial material 404. The sacrificial material 404 may comprise a spin-on organic film. However, other spin-on films, PECVD, ALD, CVD, or PVD materials, such as silicon nitride, silicon dioxide, amorphous silicon and amorphous carbon, can be employed to the same effect. A spin on sacrificial material 404 may flow over any irregularities in the underlying layers, thereby producing a flat layer where the thickness of the film depends on the height of the underlying material. The sacrificial material 404 may be deposited and then patterned to remove portions of the sacrificial material 404 that do not affect the cavity to be formed. In one embodiment, the sacrificial material 404 may be patterned such that the sacrificial material 404 spans the trench 414 so that the etching gases or liquid that removes the remainder of the sacrificial material 404 may encounter the sacrificial material 404 from the top rather than from the side through the passage 418.

One or more other layers 408, 410, and 412 may be deposited over the sacrificial material 404. The one or more other layers 408, 410, and 412 may form a part of a structure to be formed above the device 406. A trench 414 may be formed in the structure by patterning the one or more other layers 408, 410, and 412. The patterning may comprise etching.

The sacrificial material 404, after patterning, provides the shape of the cavities 416 to be formed as well as the release passage 418. After the one or more other layers 408, 410, and 412 have been patterned so that the sacrificial material 404 is exposed, the sacrificial material 404 may be removed to release the devices 406 in the cavities 416. In one embodiment, the sacrificial material 404 may be removed by plasma etching. In one embodiment, the etching gases or liquids may comprise hydrogen, fluorine, oxygen, hydrogen fluoride, chlorine, hydrochloric acid, nitrogen, helium, xenon difluoride, anhydrous hydrogen fluoride, fluorine based etching gases or liquids, oxygen based etching gases or liquids, hydrogen based etching gases or liquids, or combinations thereof.

Figure 5A:
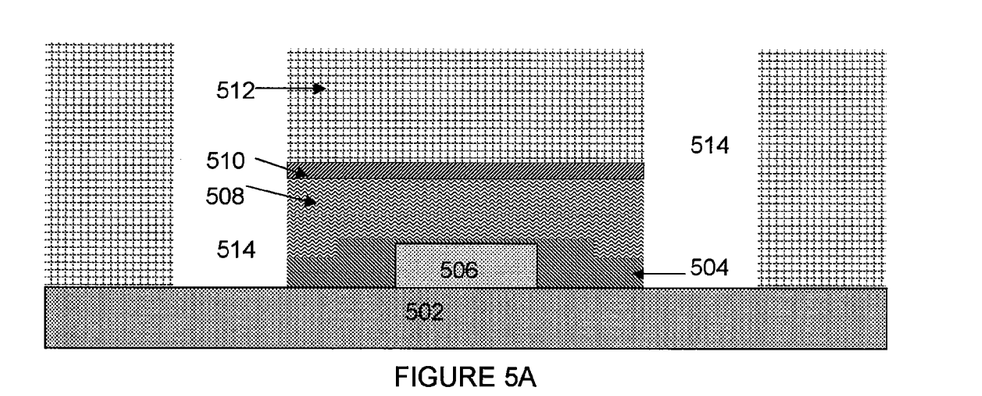
FIG. 5A is a schematic side view of a structure having a plurality of side release passages having a height less than a height of the cavity.
Figure 5B:
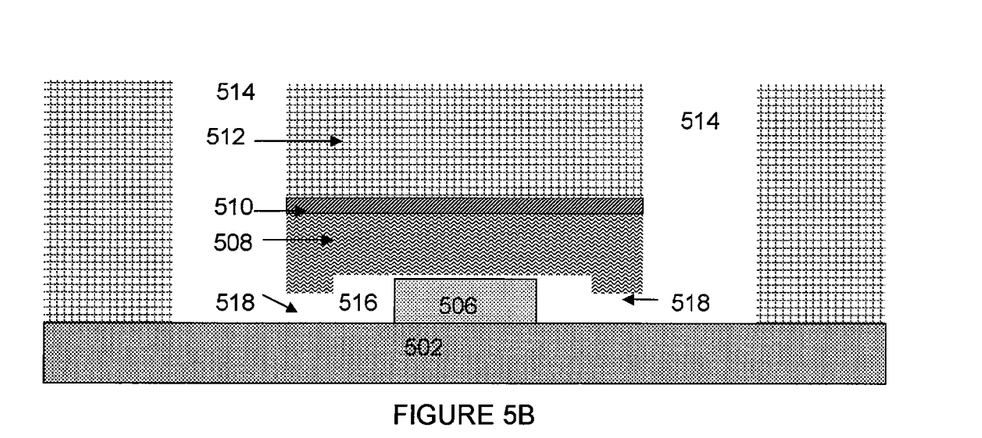
FIG. 5B is a schematic side view of the structure of FIG. 5A having the sacrificial material removed.

FIG. 5A is a schematic side view of a structure having a plurality of side release passages having a height less than a height of the cavity. FIG. 5B is a schematic side view of the structure of FIG. 5A having the sacrificial material removed. The structure has a substrate 502 upon which one or more devices 506 may be formed. In one embodiment, the substrate 502 may comprise a silicon based material. In another embodiment, the substrate 502 may comprise multiple layers of a device structure such as a CMOS structure. The devices 506 may comprise any MEMS, NEMS, MOEMS, or NOEMS device, or combinations thereof. In one embodiment, the devices 506 that may comprise a microfluidic channel that provides temperature control and improved reliability in integrated circuits. Additionally, the devices 506, in general, can be any device that may be sealed within a cavity over a substrate.

The device 506 may be enclosed in a sacrificial material 504. The sacrificial material 504 may comprise a spin-on organic film. However, other spin-on films, PECVD, ALD, PVD, and CVD materials, such as silicon nitride, silicon dioxide, amorphous silicon and amorphous carbon, can be employed to the same effect. A spin on sacrificial material 504 may flow over any irregularities in the underlying layers, thereby producing a flat layer where the thickness of the film depends on the height of the underlying material. The sacrificial material 504 may be deposited and then patterned to remove portions of the sacrificial material 504 that do not affect the cavity 516 to be formed.

One or more other layers 508, 510, and 512 may be deposited over the sacrificial material 504. The one or more other layers 508, 510, and 512 may form a part of a structure to be formed above the device 506. A trench 514 may be formed in the structure by patterning the one or more other layers 508, 510, and 512.

The sacrificial material 504, after patterning, provides the shape of the cavities 516 to be formed as well as the release passages 518. As shown in FIGS. 5A and 5B, a plurality of release passages 518 are present that each open to a trench 514. It is to be understood that multiple passages 518 may be formed that extend to a common trench 514. After the one or more other layers 508, 510, and 512 have been patterned so that the sacrificial material 504 is exposed, the sacrificial material 504 may be removed to release the devices 506 in the cavities 516. In one embodiment, the etching gases or liquids may comprise hydrogen, fluorine, oxygen, hydrogen fluoride, chlorine, hydrochloric acid, nitrogen, helium, xenon difluoride, anhydrous hydrogen fluoride, fluorine based etching gases or liquids, oxygen based etching gases or liquids, hydrogen based etching gases or liquids, or combinations thereof.

Once the cavities have been opened, the passages to the cavities may need to be closed. The use of CVD processes may not be appropriate as these will lead to the deposition of material on the active area of the device. This problem arises because plasma activated species (e.g., Si-based, metal-based or Oxygen-based species) will have a lifetime which will be long enough to reach the active area inside the cavity and may therefore be deposited on a device or other surface inside the cavity.

Additionally, the gas medium surrounding the device should also be as noble as possible to avoid any reaction that could adversely affect the device or its lifetime operation. This is especially true for transducers that may heat up during their operation and reach a level at which they react with residual gases trapped into the cavity. Therefore, chemical based processes may not be appropriate as they involve reactive gases. The encapsulation or sealing of the cavity has to be performed without deposition of materials on the active device as this would jeopardize the device operations.

Transducers are moving into the consumer market which implies very strong demand for sealing methods having limited cost. CMOS technology being the dominant process manufacturing in the industry, this means this method should be compatible with CMOS processing and should require, if any, minimum tool addition or new processing steps. Reducing costs in this field also means miniaturization which implies that this method should be as little space invading as possible to maximize the number of devices per area or per volume.

Figure 6:
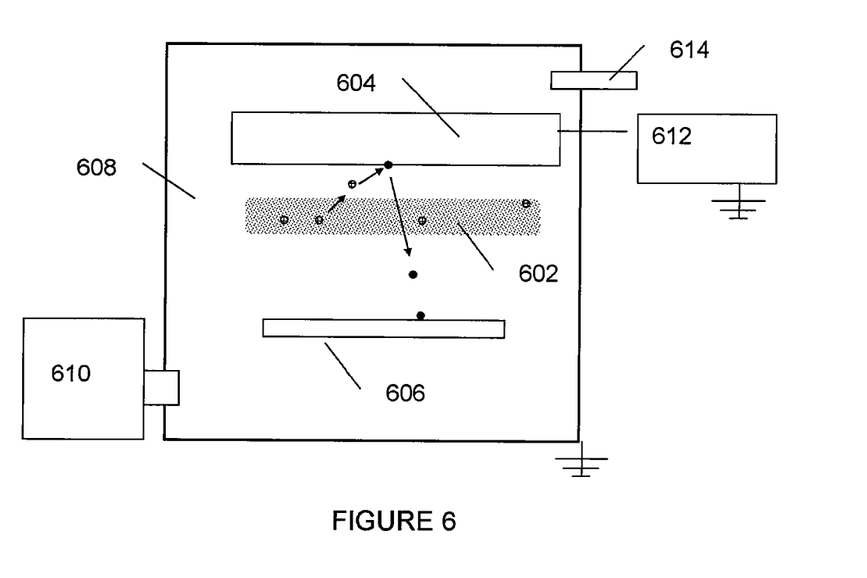
FIG. 6 is a schematic side view of a sputtering apparatus.

In order to overcome the problems with chemical based deposition, methods of physical sputtering may be used. These methods typically involve the physical vaporization of atoms from a surface by bombarding that surface with energetic atomized particles, thereby transferring the momentum of the particles to the atoms of the surface. The energetic particles, usually Argon (Ar) or Helium (He), are accelerated in an electric field or plasma 602 and then directed towards a target 604. When the particles strike the target 604 with enough energy, atoms from the target 604 are dislodged and propelled towards the substrate 606, thereby resulting in direct (i.e., line-of-sight) deposition on the substrate 606.

FIG. 6 shows a typical sputtering apparatus. The apparatus comprises a vacuum chamber 608, a pump 610, plasma 602, a power supply 612, a gas inlet 614, a target 604 and a substrate 606. The operation of the sputtering apparatus shown in FIG. 6 will be known to the skilled reader.

Whenever the particle strikes the target 604 with enough energy, species from the target 604 will be dislodged and lead to a direct or line-of-sight deposition on the substrate 606. The angle at which the sputtered atoms are emitted is often described as a cosine distribution, in that the relative amount of material sputtered at any particular angle can be compared to the amount sputtered at normal incidence times the cosine of the angle from normal incidence. The angular distribution is a function of many parameters, such as target material, incoming particles, and energy of incoming particles. An over-cosine distribution will lead to less deposition on the sides whereas an under-cosine distribution will lead to more distribution on the sides.

Figure 7:
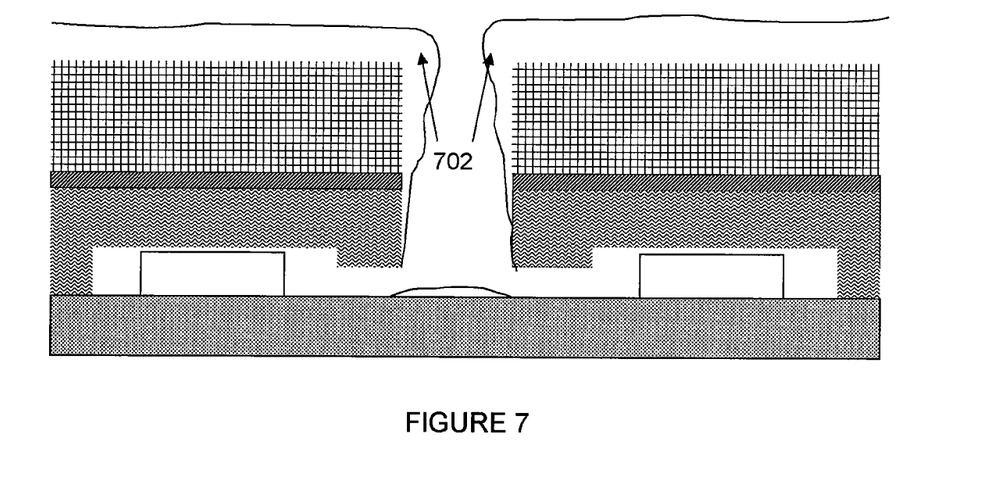
FIG. 7 is a schematic cross sectional view of structure partially sealed by a sputtering method.

As can be seen in FIG. 7, the inability of known sputtering apparatus to precisely control the distribution of the propelled particles, leads to a phenomenon known as cusping. As can be seen in FIG. 7, a build-up of sputtered material may accumulate on the sidewalls of the release hole, thereby forming what are known as cusps 702. At a certain point in the process, the cusps 702 may meet and prevent further deposition of material below the adjoining cusps 702. This will lead to a sealed released hole under which the two cavities may remain unsealed and in communication with each other.

With reference to FIGS. 8 and 9A-9C, sealing a cavity by sputtering etching will be described. An apparatus for performing sputter etching to seal the cavity comprises a vacuum chamber 802, plasma 804, a pump 806, a gas inlet 808, a coil 810 and a power supply 812 for applying an RF electrical bias. In operation, the sputtering gases are ionized in the inductive plasma 804 and, using power supply 812, are accelerated directly towards the substrate 814.

Figure 8:
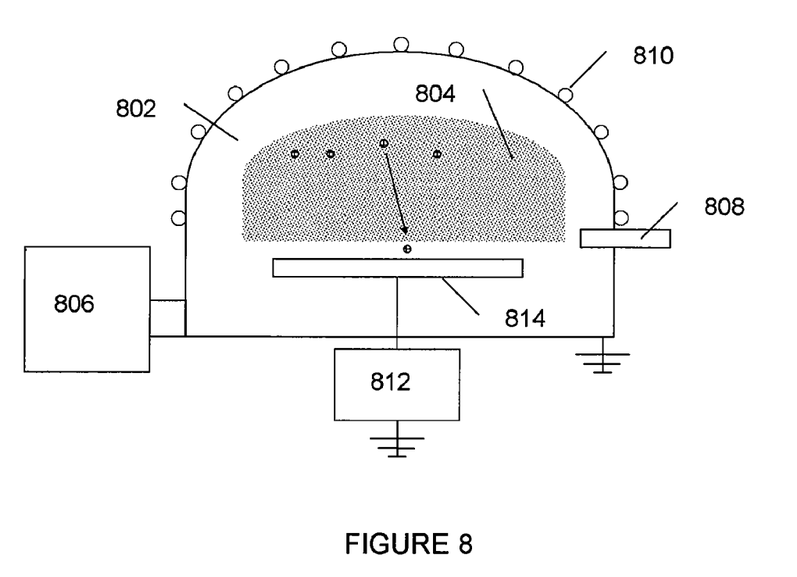
FIG. 8 is a schematic side view of another sputtering apparatus.

The material which is in the line-of-sight of the sputtered particles will be sputter etched (i.e., the substrate 814 is sputtered and is in essence equivalent to a sputtering target in a sputter deposition process) when the accelerated particles reach the surface. They will then be expelled in different directions. Some will be emitted back into the plasma 804 while others will be redeposited on the sidewall and on the cavity entrance. As will be appreciated, the apparatus can be used where the substrate 814 is negatively charged, for example, when an RF bias is applied to it, with respect to the plasma 804.

Figure 9A:
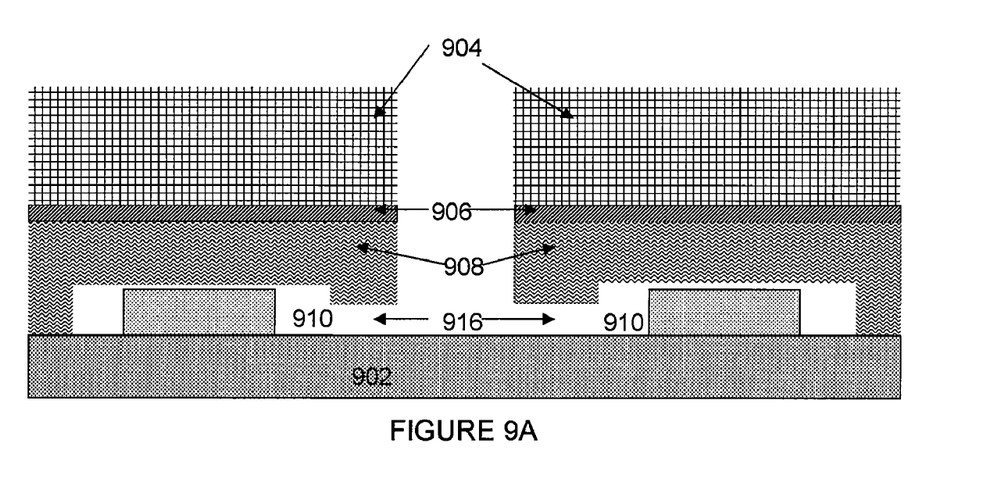
FIG. 9A is a schematic cross sectional view of a structure prior to sealing the cavities.

In FIG. 9A, both the substrate 902 and layer 904 will be sputter etched, while layer 906 and layer 908 may be sputter etched during the initial stages of the process until the surfaces are adequately coated by the sputtering and redeposition of layers 902 and 904. The resulting material will be redeposited in order to seal the cavity 910, thereby forming a redeposition layer. In one embodiment, the layer 904 may comprise a hard mask layer. The substrate 902 is locally sputter-etched at the bottom of the release hole. Material from layer 904 may also be sputter etched. The material from layer 904 may be redeposited onto the substrate 902 and along the sides of layers 906, 908 within the trench. The redeposited material from layer 904 may also sputter etch and help seal the cavity 910. Thus, the material that may seal the cavity 910 may come from the substrate 902, the layer 904, or even layers 906 and 908. In other words, the material that seals the cavity 910 comes from material already present on the structure. A separate deposition such as CVD or even sputtering from a secondary source such as a sputtering target separate from the structure or gaseous precursors is not necessary. The substrate material, and layers 904, 906, and 908 may be chosen to suit the requirements of the redeposition layer. In one embodiment, the substrate material may comprise an oxide. In other embodiments, the substrate material may comprise silicon nitride, a metal, polysilicon, and combinations thereof. Virtually any material may be used to suit the needs of the user. In general, the materials for the substrate and layers 904, 906, and 908 may be tailored to suit the needs of the user.

Figure 9B:
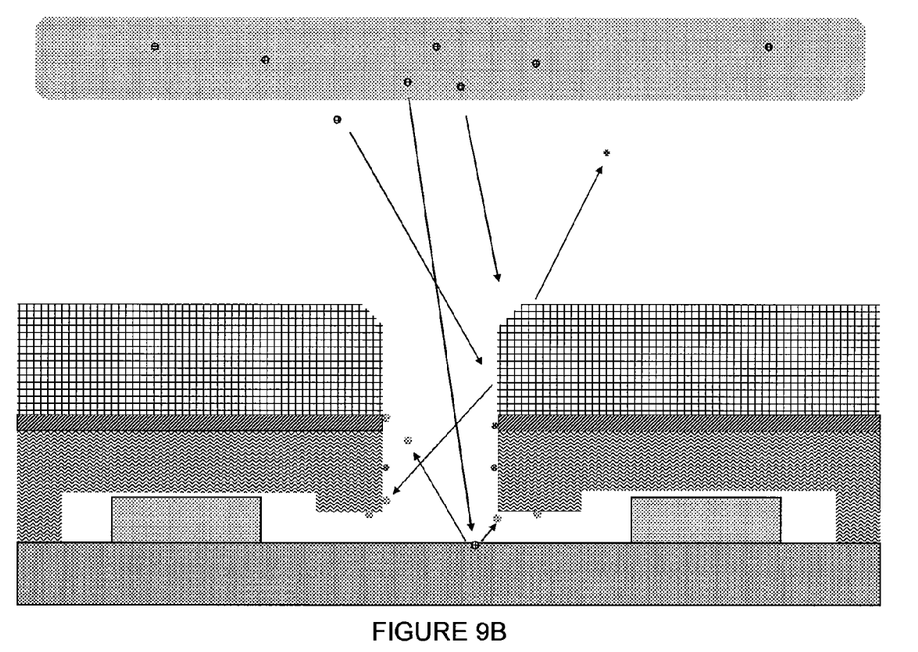
FIG. 9B is a schematic cross sectional view of the structure of FIG. 9A during a sputter etch process.

As shown in FIG. 9B, the plasma is located away from the substrate 902. Thus, the gases used for sputter etching should not be accelerated toward the external target but toward the substrate 902. This can be performed on an apparatus where the substrate 902 can be negatively biased, for example when a RF bias is applied to it, with respect to the plasma.

Some of the sputtering gases are ionized in the plasma and accelerated toward the substrate 902. The materials being in the line-of-sight of these accelerated species will be sputter etched (or sputtered) when the accelerated particles will reach the surface. They will then be expelled in different directions. Some of the expelled particles will be emitted back into the plasma, others will be redeposited on the sidewall and on the passage entrance.

Figure 9C:
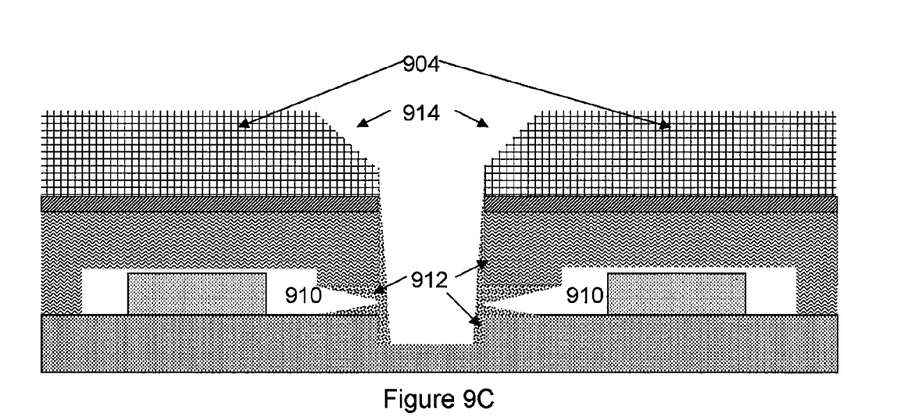
FIG. 9C is the structure of FIG. 9A after sealing the cavities.

FIG. 9C shows a plurality of cavities 910 sealed with material 912 that has been redeposited after sputter etching. The substrate 902 has been locally sputter-etched at the bottom of the via-like structure. In one embodiment, the substrate 902 provides most of the material 914 being redeposited toward the sidewall and the passage 916. The substrate material can be chosen depending on the requirements for the redeposited layer.

Layer 904 would also be sputter etch redeposited. Care should be taken in determining the material and thickness of the top layer of the multilayer stack as it would undergo most of the ion bombardments that occur during the sputter etching. Because the sputter etch rate is angle dependant, some facets 914 may form at the corner of the layer 904. These facets 914 will move further away one from another as the sputter etch pursues. However, at a point of time, enough material would have been deposited at the passage 916 to close it. An etch stop layer having a low sputtering rate can be used under layer 904 if desired. This would avoid etching layer 908 if required and limit the amount of faceting occurring during sputter etching. It can also be used to tune the ratio of resputtered material coming from the top versus the resputtered material coming from the bottom if necessary.

In one embodiment, the sputter etching may occur in a high density plasma (HDP) CVD system. In one embodiment, the sputter etching may occur in a parallel-plate type reactor. It is to be understood that the sputter etching may occur in-situ in the same chamber that the sacrificial material is removed to open the cavity. Additionally, the sputter etching may occur in a separate chamber. In one embodiment, the sputter etching may occur in a PVD chamber with the target removed. In one embodiment, the sputter etching may occur in-situ with the sealing layer that is deposited over the structure after the sputter etching is completed. In another embodiment, the sputter etching and the sealing layer deposition may occur in separate chambers.

HDP CVD is used to produce void-free gap filling and local planarization by superimposing two distinct processes in one step. One involves the formation of silicon dioxide (silica) from silane and oxygen. The second process, sputtering, removes material physically through momentum transfer between energetic incoming ions, such as ionized noble gases such as argon, krypton, helium, xenon, and combinations thereof, and the growing film surface. When using a standard HDP CVD technique, both processes are performed at the same time and gases which can adversely affect the device are constantly flowing into the chamber.

In the process discussed herein, the method consists in having two steps. In the first step, a sputter etch would be performed. Gases and process parameters would have been optimized to maximize sputter redeposition on the sidewall and toward the cavity entrance. Sputtering gases should be noble gases like Argon, Helium, Xenon, Krypton, and combinations thereof. Nobel gases have the advantage of being already widely available for standard CMOS processing. After a given time (ie., between a few seconds and a few minutes depending on the process parameters and design used), sufficient amount of materials will have been sputter-redeposited on the sidewalls and the cavity entrance is closed. Then for the second step, deposition gases such as $SiH_4$ and $O_2$ can flow and a standard HDP CVD process can be subsequently performed if needed to deposit an additional sealing or encapsulating layer over the already sealed cavity.

Figure 10:
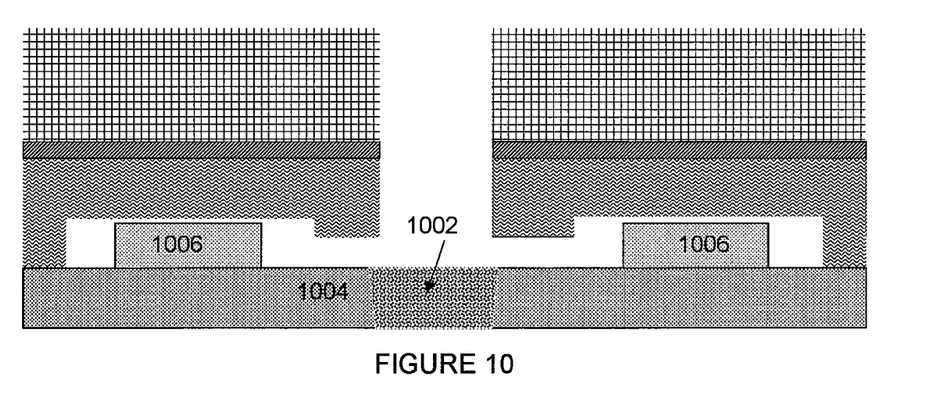
FIG. 10 is a schematic cross sectional view of a structure prior to sputter etching according to one embodiment.
Figure 11:
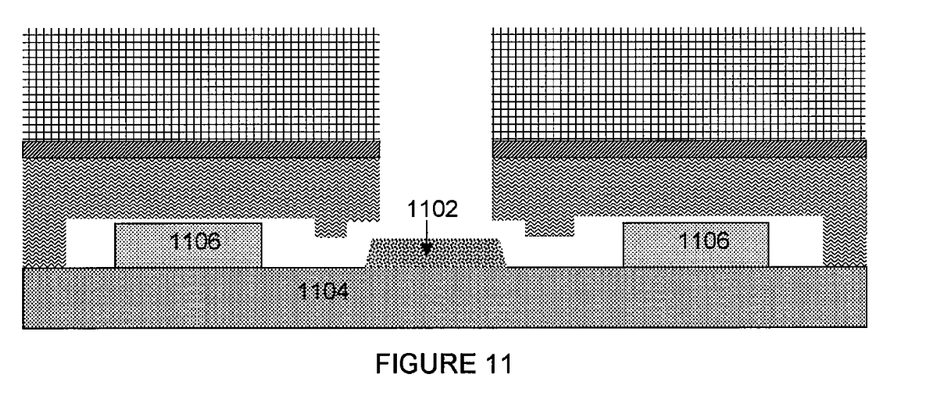
FIG. 11 is a schematic cross sectional view of a structure prior to sputter etching according to another embodiment.

FIGS. 10 and 11 show other configurations where dedicated deposition and patterning has been performed to purposely form material 1002, 1102 either in (FIG. 10) or on (FIG. 11) the substrate 1004, 1104. Once formed, the material 1002, 1102 is then used to form the redeposition layer by being sputtered during the sputter etching and redeposited to seal the cavity. Material 1002 may, for example, be obtained through the patterning and etching of substrate 1004 followed by the deposition and the chemical-mechanical polishing. Material 1102 may be obtained through deposition, patterning and etching. Material 1002, 1102 may be a subset of the layers used to create the device 1106. As will be appreciated, layers 1002, 1102 may be made of any suitable material such as oxide or nitride.

In both of the above cases, part of uppermost layer may also be sputter etched. Accordingly, care should be taken in determining the material and thickness of uppermost layer as it will be subject to most of the ion bombardment. The uppermost layer may be chosen to have a specific relative sputter etch rate relative to the material 1002, 1102.

Figure 12:
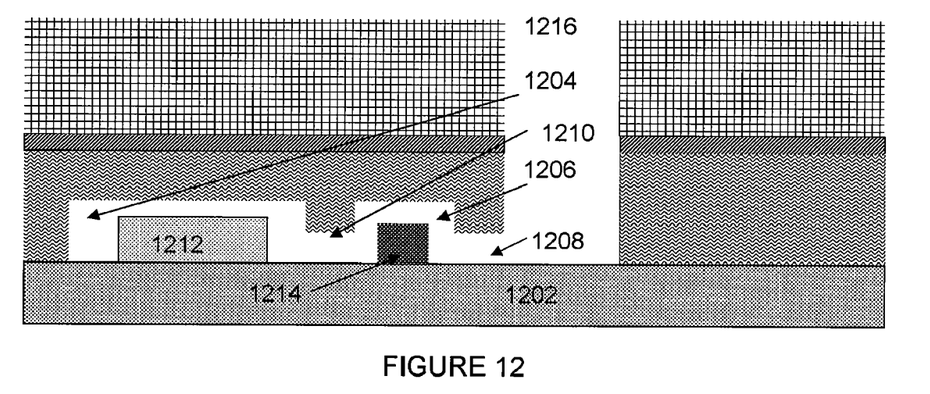
FIG. 12 is a schematic cross sectional view of a structure prior to sputter etching according to another embodiment.

FIG. 12 is a schematic cross sectional view of a structure prior to sputter etching according to another embodiment. As shown in FIG. 12, two cavities 1204, 1206 are formed over the substrate 1202. The two cavities 1204, 1206 are connected by a passage 1210. Within the first cavity 1204, a device 1212 may be formed. Within the second cavity 1206, a blocker 1214 may be formed. The cavity 1206 having the blocker 1214 may be connected to a trench 1216 by a passage 1208. The blocker 1214 may comprise at least some of the same materials as the device 1212.

The cavities 1204, 1206 may be sealed by sputter etching as described herein. To seal the cavities 1204, 1206, the passage 1208 may be blocked or filled by sputter etching. The blocker 1214 performs the function of blocking any material from reaching device 1212. Because the blocker 1214 may comprise at least some of the same materials as the device 1212, the passage 1210 between the cavities 1204, 1206 may remain open. The blocker 1214 may not interfere with the device 1212 or degrade its performance.

Figure 13A:
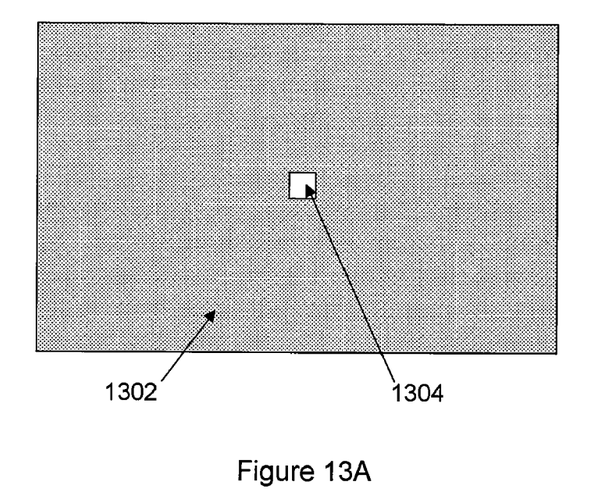
FIGS. 13A-C show a process for removing sacrificial material according to another embodiment.
Figure 13B:
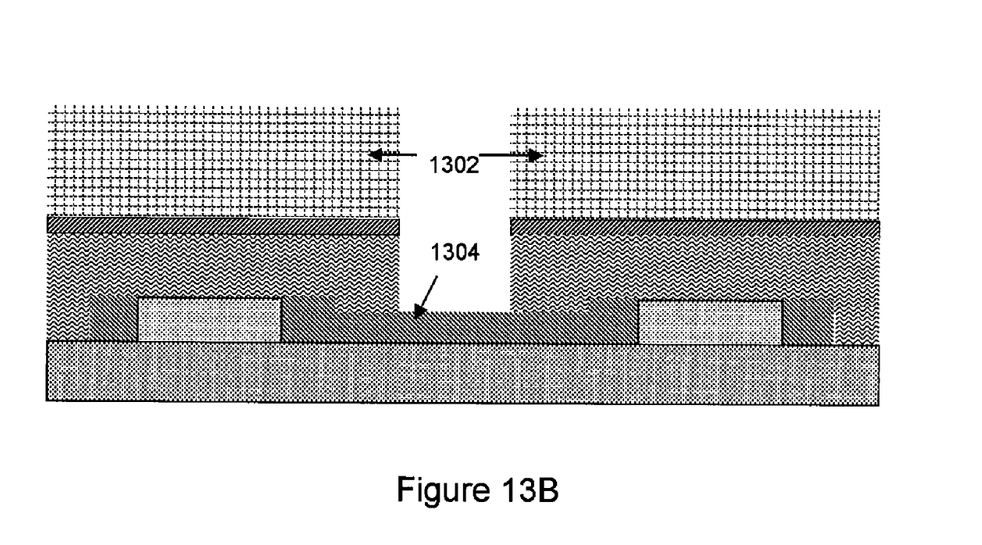
Figure 13C:
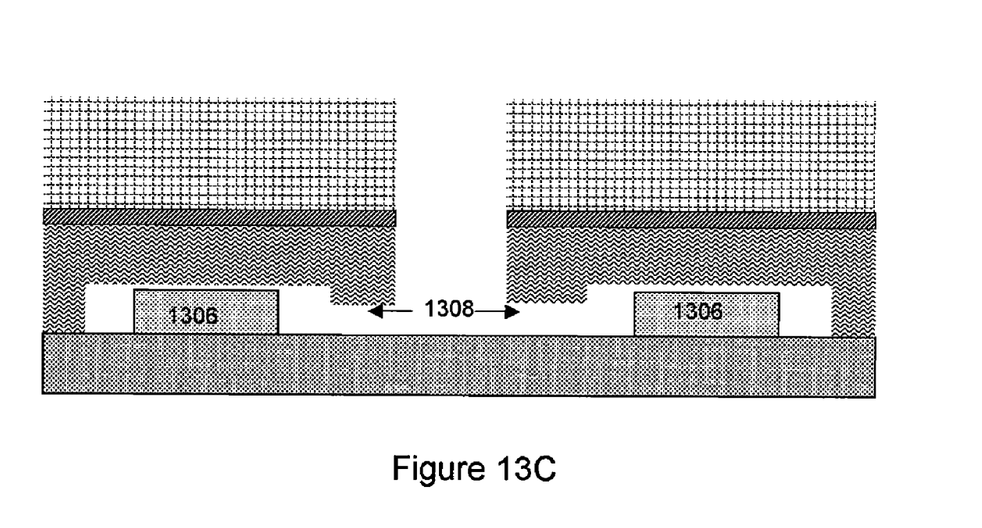

FIGS. 13A-C show a process for removing sacrificial material according to another embodiment. As shown in FIG. 13A, the sacrificial material 1304 has been exposed by removing a portion of the hard mask 1302. FIG. 13B is a cross sectional view of the FIG. 13A. As seen in FIG. 13B, the sacrificial material 1304 is exposed such that the sacrificial material 1304 may be removed by introducing the etching gases or liquids from the top of the sacrificial material 1304. As shown in FIG. 13C, the sacrificial material 1304 has been removed such that the cavities 1306 have a passage 1308 opened to the side of the cavities 1306. Thus, the embodiment shown in FIGS. 13A-13C show a side seal for the cavities 1306, but a top introduction of the etchant to remove the sacrificial material 1304.

It is to be understood that while the passages to the cavities have been shown to be near the relative bottom of the cavities, the passages could be located at the top or anywhere in the middle of the cavities.

In order to avoid or further limit the amount of material being sputter redeposited inside the cavity or towards the enclosed device, the horizontal and vertical design of the layers of the structure may be implemented such that they do not have any direct line-of-sight path between the enclosed device and the release hole entrance.

Specific gases may also be added to the sputtering gas or gases to tailor the properties of some of the sputter etched material. Noble gases may be added during the sputter etch redeposition step. For example, some gases, such as nitrogen or oxygen, may be added to the sputtered gases so that some initially conductive materials become insulating and deposit as an insulating seal over the passages to the cavities. Additionally, if desired, a gettering precursor may be flowed into the cavities to remove any additional material after the sacrificial material has been removed. The gettering, if used, is performed in addition to the sputter etching as opposed to as a stand alone process.

After the passages to the cavities have been sealed, a second sealing step can be performed in order to reinforce the seal created by sputter etch redeposition. Additionally, the second sealing step may be performed by other conventional deposition processes such as electroless plating and electrochemical plating, PECVD, PVD, CVD, ALD, and combinations thereof. Reactive gases like $SiH_4$, TEOS or $O_2$ could be used as precursors. As will be appreciated, because of the presence of the sputter etch redeposition seal, the gases from any subsequent CVD or PECVD sealing step would not enter the cavity and would therefore not harm the device enclosed therein. Finally, further standard processing steps can be performed once the cavity has been sealed.

During the sputter etch redeposition, noble gases such as Argon (Ar), Neon (Ne), Krypton (Kr), Helium (He) or Xenon (Xe) may be used. Argon and Helium will be preferably used because of their availability in most fabs. Other gases such as oxygen, nitrogen, and other gases such as for ion milling may be used. Additionally, while an HDP CVD chamber has been discussed, it is to be understood that the embodiments discussed herein may be performed in other processing chambers such as a PVD chamber, a sputter etching chamber, an ALD chamber, a CVD chamber, a PECVD chamber, an ion milling chamber, and others. While sputter etching has been described, it is to be understood that other processes may be performed such as ion milling or reactive sputter etching whereby a reactive gas may be ignited into a plasma and react with sputter etched material and redeposit as a material different than the material removed. When using a HDP CVD chamber, the coil power source will preferably be a RF source having a frequency in the range 200-500 kHz and a RF power in the range 1000-5000 W. The bias power will preferably be independently controlled by a high frequency RF source having the industry standard frequency of 13.56 MHz and a RF power in the 500-3000 W. In one embodiment, the power may be as high as 10000 W. The pressure in the apparatus could be as low as a few mT and as high as the maximum pressure which could be handled by the chamber. A higher pressure would maximize the amount of sidewall redeposition and is hence favorable for the sealing. However, the upper pressure can also be defined by the device requirements.

As will be appreciated, the use of a single device (i.e., HDP CVD device) for both sealing steps will provide significant advantages in terms of costs and manufacturing complexity. Moreover, the ability of HDP CVD to fill narrow gap is a definitive advantage for the sealing of devices having a narrow space between two opposing sidewall.

By using a sputter etch process, devices within cavities formed in a structure can be sealed without exposing the device and cavity to reactive gases. The sputter etching can be performed to redeposit material into and around the passages leading to the cavity by the physical process as opposed to a chemical process to thereby not expose the device or cavity to reactive gases and without depositing material in the cavity or on the device.

While the foregoing is directed to embodiments of the present invention, other and further embodiments of the invention may be devised without departing from the basic scope thereof, and the scope thereof is determined by the claims that follow.

The invention claimed is:

1. A method of forming a device having a substrate, one or more layers deposited thereover, the device having a cavity embedded between the substrate and the one or more layers and a first passage extending to the cavity, the method comprising:
removing material from one or more of the substrate and the one or more layers and redepositing the removed material in the first passage to seal the first passage.

2. The method of claim 1, further comprising:
depositing at least one sacrificial layer over the substrate;
removing a portion of the at least one sacrificial layer to define a shape of the cavity and at least one passage to be formed;
depositing at least one encapsulating layer over the at least one sacrificial layer;
removing a portion of the at least one encapsulating layer to expose a portion of the at least one sacrificial layer; and
removing the at least one sacrificial layer to form the cavity and the first passage through the at least one encapsulating layer.

3. The method of claim 2, further comprising depositing a capping layer over the at least one encapsulating layer and the redeposited material.

4. The method of claim 3, wherein the depositing the capping layer and the redepositing are performed in-situ.

5. The method of claim 2,
wherein removing the at least one sacrificial layer to form the cavity additionally forms a second passage through the at least one encapsulating layer.

6. The method of claim 5, further comprising removing material from the substrate and redepositing the removed material in the second passage to seal the second passage, wherein the redepositing the removed material in the first passage and the redepositing the removed material in the second passage occur substantially simultaneously.

7. The method of claim 6, wherein the substrate has a first material deposited thereon and wherein the removing and redepositing comprises sputter etching the first material and redepositing the first material in the first passage to seal the first passage.

8. A method of forming a device, comprising:
depositing at least one sacrificial layer over a substrate;
removing a portion of the at least one sacrificial layer to define a shape of a cavity and at least one passage to be formed;
depositing an encapsulating layer over the at least one sacrificial layer;

depositing a second layer over the encapsulating layer;
removing a portion of the encapsulating layer to expose a portion of the at least one sacrificial layer extending through a side of the encapsulating layer;
removing the at least one sacrificial layer to form the cavity and a first passage through the encapsulating layer; and
removing material from at least one of the second layer and the substrate and redepositing the removed material in the first passage to seal the first passage.

9. The method of claim 8, further comprising depositing a capping layer over the redeposited material.

10. The method of claim 9, wherein the depositing the capping layer and the redepositing are performed in-situ.

11. The method of claim 8, wherein the removing material from at least one of the second layer and the substrate and redepositing the removed material comprises sputter etching.

12. The method of claim 8, further comprising:
removing a portion of the encapsulating layer to expose a portion of the at least one sacrificial layer through at least a second side of the encapsulating layer; and
removing the at least one sacrificial layer to form the cavity and a second passage through the encapsulating layer.

13. The method of claim 12, further comprising removing material from one or more of the substrate and the second layer and redepositing the removed material in the second passage to seal the second passage, wherein the redepositing the removed material in the first passage and the redepositing the material in the second passage occur substantially simultaneously.

14. The method of claim 8, wherein the substrate has a first material deposited thereon and wherein the removing material from at least one of the second layer and the substrate and redepositing the removed material comprises sputter etching the first material and redepositing the first material in the first passage to seal the first passage.

15. A method of forming a device, comprising:
depositing at least one sacrificial layer over a substrate;
removing a portion of the at least one sacrificial layer to define a shape of a cavity and at least one passage to be formed;
depositing an encapsulating layer over the at least one sacrificial layer defining a shape of the cavity;
depositing a second layer over the encapsulating layer;
removing a portion of the encapsulating layer to expose a portion of the at least one sacrificial layer through a side of the encapsulating layer;
removing the at least one sacrificial layer to form the cavity and a first passage through the encapsulating layer, the first passage having a height that is less than a height of the cavity;
removing material from the second layer and the substrate and redepositing the removed material in the first passage to seal the first passage; and
depositing a capping layer over the sealed first passage, the depositing a capping layer and the redepositing the removed material occurs in-situ.

16. The method of claim 15, wherein the device is a microelectromechanical device.

17. The method of claim 15, wherein removing material from the second layer and the substrate and redepositing the removed material comprises sputter etching.

18. The method of claim 15, further comprising:
removing a portion of the encapsulating layer to expose a portion of the at least one sacrificial layer through at least a second side of the encapsulating layer; and
removing the at least one sacrificial layer to form the cavity and a second passage through the encapsulating layer.

19. The method of claim 18, further comprising removing material from the substrate and redepositing the removed material in the second passage to seal the second passage, wherein the redepositing the removed material in the first passage and the redepositing the removed material in the second passage occur substantially simultaneously.

20. The method of claim 15, wherein the substrate has a first material deposited thereon and wherein the removing material from the second layer and the substrate and redepositing the removed material comprises sputter etching the first material and redepositing the first material in the first passage to seal the first passage.

\* \* \* \* \*

UNITED STATES PATENT AND TRADEMARK OFFICE
CERTIFICATE OF CORRECTION

| | |
|---|---|
| PATENT NO. | : 7,989,262 B2 |
| APPLICATION NO. | : 12/267186 |
| DATED | : August 2, 2011 |
| INVENTOR(S) | : Mickael Renault |

It is certified that error appears in the above-identified patent and that said Letters Patent is hereby corrected as shown below:

Column 4, Line 42, delete "GaAlAs" and insert --GaAlAs-- therefor;

Column 10, Line 9, delete "ie.," and insert --i.e.,-- therefor.

Signed and Sealed this
Eighth Day of November, 2011

David J. Kappos
*Director of the United States Patent and Trademark Office*